United States Patent [19]

Garuts

[11] Patent Number: 4,950,923
[45] Date of Patent: Aug. 21, 1990

[54] ANALOG MULTIPLIER BASED SAMPLE AND HOLD NETWORK

[75] Inventor: Valdis E. Garuts, Beaverton, Oreg.
[73] Assignee: Tektronix, Inc., Beaverton, Oreg.
[21] Appl. No.: 386,318
[22] Filed: Jul. 28, 1989
[51] Int. Cl.$^5$ .............................................. G11C 27/02
[52] U.S. Cl. .................................. 307/353; 307/358; 307/494; 328/151
[58] Field of Search ............... 307/261, 353, 352, 358, 307/494, 498; 328/151, 156, 158, 160, 167

[56] References Cited

U.S. PATENT DOCUMENTS

| | | | |
|---|---|---|---|
| 3,550,021 | 12/1970 | Freeny | 328/151 |
| 3,743,947 | 7/1973 | Fixler et al. | 328/156 |
| 3,781,694 | 12/1973 | Lefevre et al. | 328/151 |
| 4,717,837 | 1/1988 | Garuts . | |

Primary Examiner—John Zazworsky
Attorney, Agent, or Firm—John Smith-Hill; Peter J. Meza

[57] ABSTRACT

A sample and hold network is provided having an analog multiplier that multiplies the analog input signal by a sinusoidal strobe signal to produce a multiplied signal. The multiplied signal is filtered by a bandpass differentiating filter and is combined in a differential amplifier with the analog input signal to yield a periodically sampled and held version of the analog input signal. The bandpass differentiating filter attenuates or eliminates undesirable DC and frequency components.

6 Claims, 2 Drawing Sheets

ANALOG MULTIPLIER BASED SAMPLE AND HOLD NETWORK

BACKGROUND OF THE INVENTION

The present invention relates to a sample and hold network for sampling an input data signal and for periodically providing a sample output signal having a value equal to the value of the input data signal for a predetermined period of time.

A prior art sample and hold network is shown in FIG. 2 of U.S. Pat. No. 4,717,837 issued Jan. 5, 1988 entitled "Sample and Hold Network" to Valdis E. Garuts. This sample and hold network eliminates the strobe pulse generator, sampling switch, and hold capacitor found in conventional prior art sample and hold networks. Instead, a differentiator, analog multiplier, sinusoidal strobe signal, and differential amplifier are implemented. In doing so, the high frequency components introduced by the rectangular pulses of the strobe pulse generator are eliminated. However, the differentiation and multiplication of the input signal introduces an undesirable DC component and undesirable frequency components that are harmonics of the input and strobe signals.

What is desired is a novel sample and hold network that eliminates the strobe pulse generator, sampling switch, and hold capacitor found in conventional prior art sample and hold networks but also eliminates the undesirable DC and frequency components found in the sample and hold network taught in U.S. Pat. No. 4,717,837.

SUMMARY OF THE INVENTION

Therefore according to the present invention a sample and hold network is provided having an analog multiplier that multiplies the analog input signal by a sinusoidal strobe signal to produce a multiplied signal. The multiplied signal is filtered by a bandpass differentiating filter and is combined in a differential amplifier with the analog input signal to yield a periodically sampled and held version of the analog input signal. The bandpass differentiating filter attenuates or eliminates undesirable DC and frequency components.

It is therefore a principal object of this invention to provide a sample and hold network capable of high frequency sampling of an analog input signal without the undesirable DC and frequency components found in the prior art due either to high frequency rectangular sampling pulses or harmonics of the input and strobe signals.

Yet a further object of this invention is to provide a sampled output signal that has the same value as the analog input signal at the sample times.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
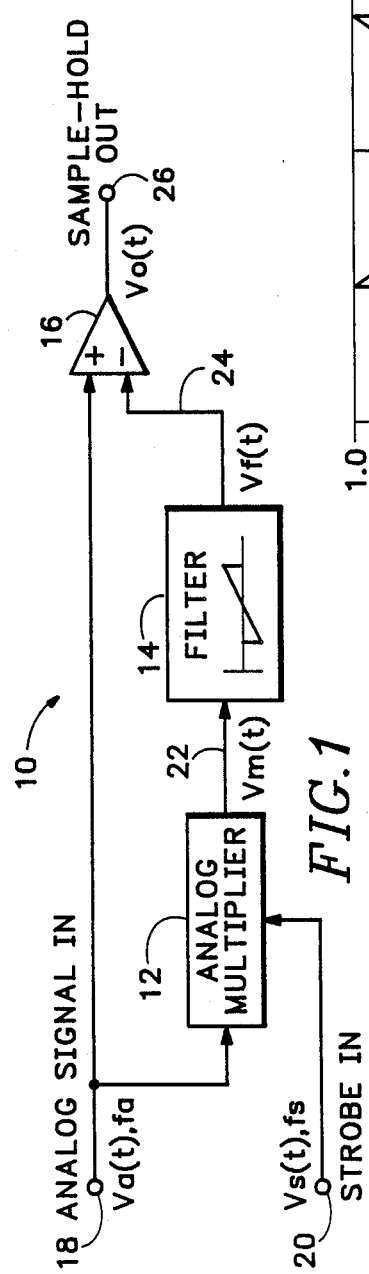
FIG. 1 is a block schematic diagram of a sample and hold network constructed according to the present invention.

Referring to drawing FIG. 1, a sample and hold network 10 according to the present invention receives an analog input signal Va(t) having a frequency fa at input terminal 18. A corresponding strobe signal Vs(t) having a frequency fs is received at strobe terminal 20. The strobe signal Vs(t) and the analog input signal Va(t) are multiplied by an analog multiplier 12 to produce a multiplied signal Vm(t). The multiplied signal Vm(t) is received by the bandpass differentiating filter 14 through connecting wire 22. The multiplied signal Vm(t) is filtered by the differentiating filter 14 to produce a filtered signal Vf(t) at connecting wire 24. The analog input signal Va(t) and the filtered signal Vf(t) are combined in a differential amplifier 16 to produce a sample and hold output signal Vo(t) at output terminal 26.

Figure 2:
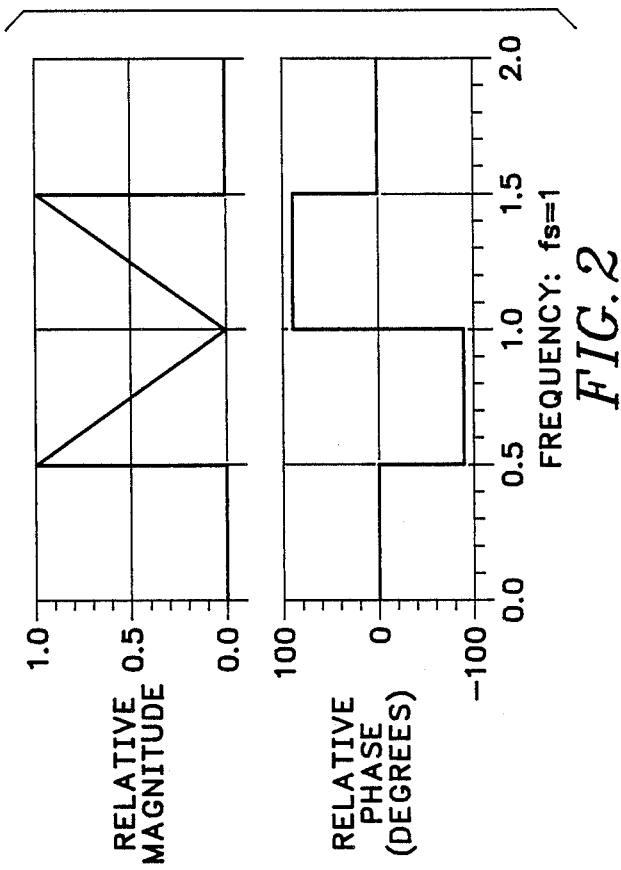
FIG. 2 is a combination magnitude and phase plot of transfer function of the bandpass differentiating filter as implemented in the present invention wherein the phase is referenced to its mean value at the sampling frequency $fs = 1$.

The idealized transfer function of the bandpass differentiating filter 14 is shown in FIG. 2. The center frequency of the filter is set to the frequency of the sinusoidal strobe signal, fs, which is normalized to a frequency of 1. Thus, the relative magnitude for all frequencies up to the beginning of the passband at one half the center frequency is zero. In the passband from one half the center frequency up to the center frequency, the relative magnitude linearly decreases from unity to zero, whereas the phase is $-90$ degrees relative to the mean phase. In the passband from the center frequency up to one and a half times the center frequency the relative magnitude linearly increases from zero to unity, whereas the phase is $+90$ degrees relative to the mean phase. Beyond the passband the relative magnitude of the filter is zero.

For a better understanding of the sample and hold technique according to the present invention the multiplier gain and sampling times are analyzed according to the signal conventions adopted in FIG. 1.

Assuming that the analog input signal is a sinewave of peak amplitude Vao with frequency fa, the radian frequency is $Wa = 2*pi*fa$ and:

$$Va(t) = Vao * \sin(Wa * t) \qquad [1]$$

Assuming that the strobe signal is a sinewave of peak amplitude Vso with frequency fs, the radian frequency is $Ws = 2*pi*fs$ and:

$$Vs(t) = Vso * \sin(Ws * t) \qquad [2]$$

For greater clarity in the algebra, the analog input signal phase and the strobe signal phase are respectively defined as $Pa = Wa*t$ and $Ps = Ws*t$, where the phases Pa and Ps are understood to be functions of time Substituting Pa and Ps gives:

$$Va(t) = Vao * \sin(Pa) \qquad [3]$$

$$Vs(t) = Vso * \sin(Ps) \qquad [4]$$

The multiplied signal Vm(t) is the product of the analog input signal Va(t) and the strobe signal Vs(t):

$$Vm(t) = Vao*Vso/Vmo * \sin(Pa)*\sin(Ps) \quad [5]$$

where Vmo is the gain factor of the multiplier For clarity, a gain factor Km is defined as:

$$Km = Vao*Vso/Vmo \quad [6]$$

Substituting equation [6] into equation [5] gives:

$$Vm(t) = Km * \sin(Pa)*\sin(Ps) \quad [7]$$

Applying a well known trigonometric identity to equation [5] produces $$Vm(t) = Km/2 * [(\cos(Ps-Pa) - \cos(Ps+Pa)] \quad [8]$$

Assuming the filter characteristics as in FIG. 2, and defining the filter output due to the difference and sum frequency components of Vm(t) as Vfd(t) and Vfs(t) respectively, then the filter output is given by:

$$Vfd(t) = Km/2 * fa * \cos(Ps-Pa-pi/2) \quad [9a]$$

$$Vfs(t) = Km/2 * fa * \cos(Ps+Pa+pi/2) \quad [9b]$$

The fa term in equations [9a] and [9b] is due to the response of the filter, which increases linearly from fs in proportion to fa as shown in FIG. 2. The total filter output Vf(t) is the sum of the two components given in equations [9a] and [9b]. Adding and simplifying produces:

$$\begin{aligned} Vf(t) &= Vfd(t) + Vfs(t) \\ &= Km * fa * \sin(Ps)*\cos(Pa) \end{aligned} \quad [10]$$

The output of the difference amplifier is the output signal Vo(t) and is given by the difference of the analog input signal Va(t) and the filter output Vf(t), thus:

$$\begin{aligned} Vo(t) &= Va(t) - Vf(t) \quad [11] \\ &= Vao * \sin(Pa) - Km * fa * \sin(Ps)*\cos(Pa) \quad [12] \end{aligned}$$

At a sample time defined as time ts having a corresponding phase of Pss, it is desired that the output signal Vo(ts) be equal to the analog input signal, therefore Vo(ts)=Va(ts)−Vf(ts)=0. In order to force the right hand side of equation [10] to be zero, we must have:

$$\sin(Pss) = 0 \quad [13]$$

which is true if and only if:

$$Pss = n * pi, \text{ wherein n is an integer} \quad [14]$$

Thus, the strobe phases Pss are potential sample times.

However, at the sample times, the rate of change of the output must also be zero in order to achieve the "hold" function Differentiating Vo(t) in [12] produces:

$$\begin{aligned} Vo'(t) &= Vao * fa * \cos(Pa) - \quad [15] \\ & Km * fa * fs * \cos(Ps)*\cos(Pa) + \\ & Km * fa \; 2 * \sin(Ps)*\sin(Pa) \\ &= 0 \text{ at } Ps = Pss. \quad [16] \end{aligned}$$

The third term on the right hand side of equation [15] is zero since sin(Pss) is zero from equation [13]. Therefore for equation [16] to be correct the first and second terms of the right hand side of the equation must be equal. Therefore:

$$Vao = Km * fs * \cos(Pss) \quad [17]$$

At the potential sample phases Pss given by equation [14], cos(Pss)=1 for even n and cos(Pss)=−1 for odd n. Since only a positive value can satisfy equation [17], the actual sample phases are:

$$Pss = 2 * n * pi, \text{ where n is an integer.} \quad [18]$$

The sample times, recalling that Ps=2*pi*fs*t, are:

$$ts = n/fs, \text{ where n is an integer.} \quad [19]$$

The multiplier gain factor Vmo, is determined from equation [17] at phase Pss and is:

$$Vao = Km * fs \quad [20]$$

Therefore the multiplier gain factor Vmo is, substituting from equation [6], equal to:

$$Vmo = Vso * fs \quad [21]$$

Therefore, sampling takes place only on the positive-going zero crossings of the strobe signal Vs(t), and the system operates correctly if the multiplier gain is set according to the requirements of equation [21].

Figure 3:
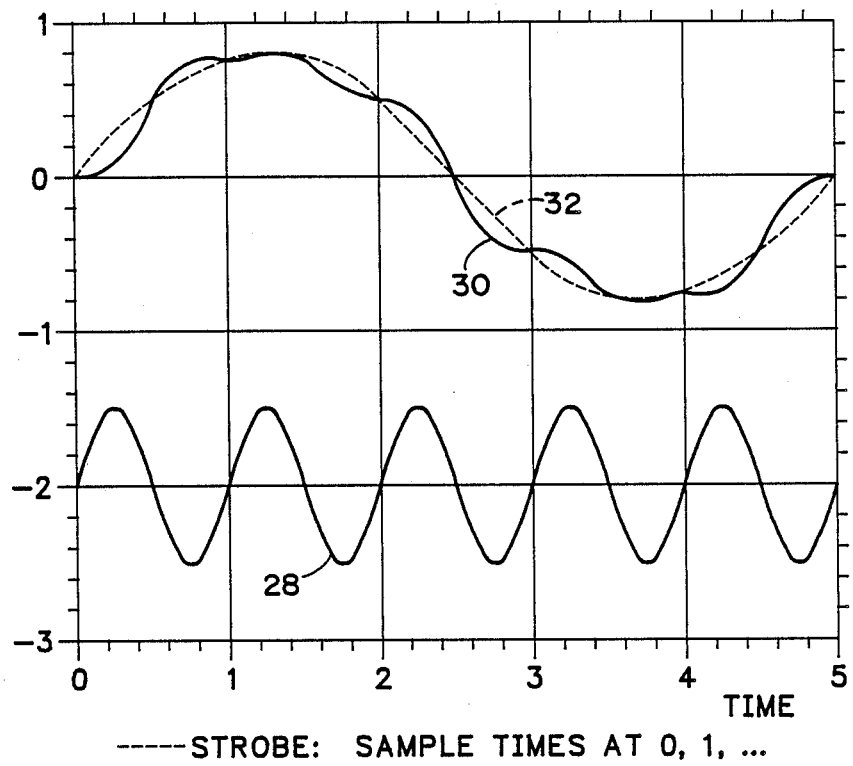
FIG. 3 is a waveform diagram of the sinusoidal strobe signal and the analog input signal superimposed on the output of the sample and hold network according to the present invention.

The timing of the analog input signal Va(t), the strobe signal Vs(t), and the output signal Vo(t) is shown in the waveform diagram in FIG. 3. A sinusoidal analog input signal 32 is shown in conjunction with a sinusoidal strobe signal 28. The sampled output signal 30 is shown having a zero slope at the positive-going zero crossings of the sinusoidal strobe signal 28.

The preceding analysis has been based on a sinusoidal analog input signal. However, the output signal Vo(t) is linear with respect to the analog input signal Va(t) as shown in equation [12], and therefore superposition applies. Thus the analysis can be extended to non-sinusoidal input signals by operating individually on the spectral components of the input signal, and summing the corresponding output components.

The maximum frequency component in the sampled output signal is one and a half times the strobe signal frequency, which is the theoretical minimum for non-aliased sampling. From equation [8] the maximum frequency component of the multiplied signal was given by the sum frequency fs+fa. To avoid aliasing, the relationship between the analog input signal and the strobe signal is given by the Nyquist criterion. That is, the analog input signal frequency fa must be less than the strobe signal frequency divided by two, fs/2. Therefore the maximum frequency component in the sampled output signal is 3*fs/2.

For a non-ideal multiplier, the output generally contains a constant component, the fundamentals and all harmonics of both input signals, and the sum and difference frequencies of all of the above frequency components. Assuming that there is no aliasing (fa<0.5*fs), the frequency components of the output signal are given by:

Constant component: zero frequency [22a]

Strobe harmonics: ks * fs, ks = 1, 2, ... [22b]

Signal harmonics: ka * fa, ka = 1, 2, ... [22c]

Sum frequencies: ks*fs + ka*fa [22d]

The constant and strobe harmonic frequency components are rejected by the filter as described. At the strobe signal fundamental frequency, fs, the filter has zero gain. Higher strobe harmonics (ks > 1) are rejected because they lie outside the edge of the passband of the filter, 1.5*fs.

Assuming no aliasing, the fundamental frequency component of the analog input signal is below the passband of the bandpass differentiating filter and thus will be filtered out. However, higher harmonics of the analog input signal can pass through the filter. In general harmonics that satisfy the following relation:

0.5*fs/ka < fa < 1.5*fs/ka where ka = 2, 3, ... [23]

will be present in the output signal. The largest such component is the second harmonic, the next highest being the third harmonic. If the multiplier is accurate at low frequency, and is capable of operating well at 1.5*fs, then stable performance should be achievable at 0.5*fs and the resultant error due to analog signal harmonics should be small. Higher harmonics will cause even less error.

Sum frequency components involving strobe harmonics where ks is greater than one are all above the upper cutoff frequency of the filter. Sums of the strobe fundamental and signal harmonics will pass through the filter if the following relation is satisfied:

fa < 0.5*fs/ka where ka = 2, 3, ... [24].

The highest signal frequency for this to occur is fs/4. Note that the fundamental sum (fs + fa) is required as shown in equation [8].

Difference frequency components of strobe harmonics where ks is greater than one and the signal fundamental will not pass through the filter if there is no aliasing, i.e. fa < fs/2. Differences of the strobe fundamental and signal harmonics where ka is greater than one will pass through the filter if equation [24] is satisfied. Additionally, differences of strobe and signal harmonics will pass through the filter if:

0.5*fs < ks*fs − ka*fa < 1.5*fs or, equivalently:

fs*(ks − 1.5)/ka < fa < fs*(ks − 0.5)/ka [25]

For the second harmonic, and assuming no aliasing, this becomes:

0.25*fs < fa < 0.5*fs

Higher strobe harmonics where ks > 2 require higher signal harmonics to cause difference components within the passband of the filter, i.e. at a lower signal fundamental where the accuracy of the multiplier is improved.

In sum, the constant components and all strobe harmonics are rejected by the filter, such that the multiplier performance with respect to the strobe input is not critical. However, performance with respect to the signal input is important up to the Nyquist limit.

In practical bandpass filters, the response outside the passband is small but non-zero, which means that the signal components completely rejected by the ideal filter are in practice present to a small degree. Similarly, the passband to stopband transitions have a finite, non-zero frequency range, which means that it is desirable that input signal frequencies stop short of the Nyquist (fs/2) limit.

In addition, a practical multiplier and filter will have a fixed, non-zero delay, in addition to the filter phase shift shown in FIG. 2. To obtain correct subtraction of Va(t) and Vf(t) in the differential amplifier 16 shown in FIG. 1, it is desirable that a compensating delay line be inserted in series with the positive input of the amplifier.

An analog multiplier based sample and hold network has been shown that retains the advantages of the prior art, yet minimizes the magnitude and frequency of strobe and input signal harmonics as well as multiplier errors. Many modifications and variations are possible in light of the above teachings. For example, there are several well known techniques in the art for realizing the filter transfer function and frequency response shown in FIG. 2. The appended claims are intended to cover and embrace any such modifications that fall within the true spirit and scope of the invention.

I claim:

1. A sample and hold network responsive to an analog input signal comprising:
    (a) means for multiplying the analog input signal by a strobe signal to produce a multiplied signal wherein the strobe signal is generated independently of the analog input signal and has a frequency higher than twice that of the highest frequency of the analog input signal;
    (b) a bandpass differentiating filter for filtering the multiplied signal to produce a filter signal; and
    (c) means for combining the filtered signal with the analog input signal to provide an output signal having a waveform whose slope is substantially equal to zero for periods of time that are predetermined fractions of the wavelength of the analog input signal.

2. The sample and hold network of claim 1 wherein the strobe signal has a sinusoidal waveform.

3. The sample and hold network of claim 1 wherein said combining means is a differential amplifier for determining the amplitude difference between the filtered signal and the analog input signal.

4. The sample and hold network of claim 1 wherein said bandpass differentiating filter has a center frequency equal to the frequency of the strobe signal and a passband that extends from one half of the center frequency to one and one half times the center frequency.

5. The sample and hold network for claim 4 wherein the relative magnitude of said bandpass differentiating filter for all frequencies up to the beginning of the passband is essentially zero, in the passband from one half the center frequency up to the center frequency, the relative magnitude linearly decreases from unity to zero, whereas the relative phase is −90 degrees, in the passband from the center frequency up to one and a half times the center frequency the relative magnitude linearly increases from zero to unity, whereas the relative phase is +90 degrees, and beyond the passband the relative magnitude of the filter is essentially zero.

6. A method for producing a sample and hold function responsive to an analog input signal comprising the steps of:
(a) multiplying the analog input signal by a strobe signal to produce a multiplied signal wherein the strobe signal is generated independently of the analog input signal and has a frequency higher than twice that of the highest frequency of the analog input signal;
(b) bandpass differentially filtering the multiplied signal to produce a filtered signal; and
(c) combining the bandpass differentially filtered signal with the analog input signal to provide an output signal having a waveform whose slope is substantially equal to zero for periods of time that are predetermined fractions of the wavelength of the analog input signal.

* * * * *